(12) United States Patent
Masuda et al.

(10) Patent No.: US 6,211,088 B1
(45) Date of Patent: Apr. 3, 2001

(54) MANUFACTURING METHOD FOR SEMICONDUCTOR GAS-PHASE EPITAXIAL WAFER

(75) Inventors: Sumihisa Masuda; Masato Sakai, both of Imari (JP)

(73) Assignee: Sumitomo Metal Industries, Ltd., Osaka (JP)

(*) Notice: Subject to any disclaimer, the term of this patent is extended or adjusted under 35 U.S.C. 154(b) by 0 days.

(21) Appl. No.: 09/368,707

(22) Filed: Aug. 5, 1999

(30) Foreign Application Priority Data

Aug. 31, 1998 (JP) .................................. 10-262477

(51) Int. Cl.$^7$ .................. H01L 21/302; H01L 21/461
(52) U.S. Cl. ............................................ 438/691
(58) Field of Search .................... 438/692, 691, 438/690, 460, 689, 693, 704, 706, 711, 716, 718, 733, 735, 745, 749, 734; 117/97; 216/88

(56) References Cited

U.S. PATENT DOCUMENTS

| | | | |
|---|---|---|---|
| 5,882,401 | * 3/1999 | Maruyama et al. | 117/97 |
| 5,882,539 | * 3/1999 | Hasegawa et al. | 216/88 |
| 5,942,445 | * 8/1999 | Kato et al. | 438/691 |
| 5,981,392 | * 11/1999 | Oishi | 438/691 |

* cited by examiner

Primary Examiner—Matthew Smith
Assistant Examiner—Calvin Lee
(74) Attorney, Agent, or Firm—Breiner & Breiner

(57) ABSTRACT

The present invention has as an object, the provision of a manufacturing method for a semiconductor gas-phase epitaxial wafer which achieves the extremely high wafer flatness demanded in line with making wafers larger in size and heightening device process integration levels, and which forms either a backside CVD film or a thermal oxide film required as a gas-phase epitaxial wafer, and solves problems related thereto. More particularly, it achieves the high flatness and low processing deformation required by a large-diameter wafer, and makes it possible to enhance yield in the device process. In a manufacturing method for a semiconductor gas-phase epitaxial wafer, which enables a thin, disc-shaped wafer to be sliced from a single-crystal ingot, a required surface to be finished to a mirror surface, and an epitaxial layer to be formed on the main surface, that introducing into the above-mentioned manufacturing method a two-sided polishing process for polishing both the front and back surfaces of a wafer; a process for forming either a CVD film or a thermal oxide film on the backside of a wafer; and a one-sided mirror-finish polishing process for polishing the main surface of a wafer enables the realization of the extremely high wafer flatness demanded by a large-diameter wafer, while preventing autodoping.

7 Claims, 1 Drawing Sheet

MANUFACTURING METHOD FOR SEMICONDUCTOR GAS-PHASE EPITAXIAL WAFER

FIELD OF THE INVENTION

The present invention relates to a manufacturing method for a semiconductor gas-phase epitaxial wafer, having a silicon epitaxial layer, which is grown on a main surface of a wafer, and used as a substrate for circuit elements of LSI (large-scale integration). More specifically, the present invention relates to a manufacturing method for a semiconductor gas-phase epitaxial wafer. In which a two-sided polishing process, a wafer backside CVD film growth process, and a one-sided polishing process, which polishes the main surface, are performed when preparing a wafer for epitaxial growth, thereby achieving extremely outstanding flatness, and a large-diameter with particularly high precision, and therefore increasing the precision and quality of the silicon epitaxial layer grown thereafter.

DESCRIPTION OF THE PRIOR ART

The large-scale integration of silicon semiconductor devices is progressing with high speed, and the characteristics required of silicon wafers have become increasingly more demanding. For this kind of highly-integrated device, CZ silicon wafers, grown using the Czochralski (hereinafter referred to as CZ) process, have been used for some time now.

A CZ silicon wafer contains supersaturated interstitial oxygen in concentrations from $(10{\sim}18) \times 10^{17}$ atoms/cm$^3$, and it is widely known that oxygen precipitates and crystal defects, which occur inside a wafer at a sufficient distance from the device active area, have a gettering effect on heavy metal impurities.

Meanwhile, in line with the downscaling of semiconductor devices, high-energy ion implantation has come to be used in the formation of a well diffusion layer, and the device process is being carried out at low temperatures of less than 100° C. so as to achieve shallow junction depth.

Consequently, there is not enough outward diffusion of oxygen, and it is becoming difficult to curb the generation of crystal defects in the device active area. This situation has led to the widespread use for today's high-integration devices of a silicon epitaxial wafer, which has a completely crystal defect-free, high-quality epitaxial layer grown on a CZ-Si substrate.

A semiconductor gas-phase epitaxial wafer manufacturing method for preparing the above-mentioned epitaxial wafer comprises; 1) a slicing process, which produces a thin, disk-shaped wafer by slicing a single-crystal ingot pulled in accordance with a single-crystal pulling apparatus; 2) an edge contouring process for preventing chips and cracks in a wafer; 3) a lapping process for making an edge-contoured wafer flat; 4) an etching process for removing a processing deformed layer generated in a wafer in accordance with the above-mentioned processing; 5) an edge-contoured portion polishing process, in which the edge-contoured portion of a wafer is finish polished; 6) a polishing process, in which either one side or two sides of the above-mentioned wafer is polished; and 7) a process, in which the above-mentioned wafer is finish polished.

Further, an epitaxial wafer is manufactured by growing, via gas-phase epitaxy, a lightly-doped epitaxial layer on the main surface of a heavily-doped single-crystal wafer. Thus, when heated at a high temperature in a hydrogen atmosphere, the backside of the wafer is etched by the hydrogen, and dopant, which was added in a high concentration, is effused. This dopant is incorporated into the epitaxial layer once again during epitaxial growth, a process known as the autodoping phenomenon.

In the past, in order to prevent the autodoping phenomenon, either a CVD film, in accordance with a CVD reactor, or a thermal oxide film was formed on the backside of a wafer for use in gas-phase epitaxy, so that the backside of the wafer would not be etched by the hydrogen in the gas-phase epitaxy apparatus.

Further, when a CVD film and thermal oxide film are formed on the backside of a wafer as described above, in accordance with the above-mentioned film being formed on the edge-contoured portion, the reactant gas comes in contact with the wafer peripheral surface in the epitaxial growth process, generating Si aggregates. This is a problem in that the aggregated silicon falls off the wafer surface in the semiconductor device fabrication process, becoming the cause of contaminants adhering to the wafer surface.

Accordingly, a method has been proposed (Japanese Patent Laid-open Nos. 9-199465 and 10-070080), whereby, after the formation of either a CVD film, or a thermal oxide film on the backside of a wafer, the above-mentioned film covering the edge-contoured portion is removed prior to epitaxial growth.

As described above, a gas-phase epitaxial wafer was manufactured using a large number of processes, including a method by which a CVD film and thermal oxide film were formed on the backside of a wafer that had undergone a variety of polishing processes and had been etched. Then the above-mentioned film covering the edge-contoured portion was removed ahead of time, and the main surface side subjected to one-sided polishing.

As for this gas-phase epitaxial wafer, the degree of flatness required in a wafer has become more stringent in line with the increasing level of integration of today's device processes, and plans for making wafers larger with diameters of 12 inches or more have made it difficult to achieve the flatness required using conventional manufacturing methods.

SUMMARY OF THE INVENTION

An object of the present invention is to provide a manufacturing method for a semiconductor gas-phase epitaxial wafer, which achieves the extremely high wafer flatness demanded in line with making wafers larger in size and increasing the level of integration of the device processes, and for forming on the backside of a wafer either a CVD film or a thermal oxide film required for a gas-phase epitaxial wafer, and solving the problems related thereto, and more particularly, achieves the high degree of flatness, and low processing deformation required by large-diameter wafers, and enhances the yield in the device process.

The inventors, with the object of achieving a semiconductor wafer with a high degree of flatness and low processing deformation, and enhancing yield in the device process, carried out a variety of studies involving grinding and polishing processes in a manufacturing method for a semiconductor gas-phase epitaxial wafar, which enables a thin, disc-shaped wafer to be sliced from a single-crystal ingot, a required surface to be finished to a mirror surface, and an epitaxial layer to be formed on the main surface.

As a result, the inventors brought the present invention to completion based on the knowledge that introducing into the above-mentioned manufacturing method a two-sided polishing process for polishing both the front and back surfaces of a wafer; a process for forming either a CVD film or a thermal oxide film on the backside of a wafer; and a one-sided mirror-finish polishing process for polishing the main surface of a wafer enables the realization of the extremely high wafer flatness demanded by a large-diameter wafer, while preventing autodoping.

Further, the inventors learned that in the above-described manufacturing process, the two-sided polishing process can be replaced by a series of processes comprising a two-sided grinding process, a finish grinding process for finish grinding either one side or both sides of a wafer with a high degree of precision and low deformation, and an alkali cleaning process, providing the same working effect as the two-sided polishing process.

Furthermore, the inventors learned that in the above-described manufacturing process, it is possible to enhance yield in the device process by adding a process which removes that portion of the CVD film or thermal oxide film which was provided to the backside of a wafer, and which wrapped around to the front side of the wafer during growth, and was generated up to the edge-contoured portion of the wafer. For example, a process which removes the film from the edge-contoured portion by bringing an etchant-impregnated material in contact with same, or which removes the film from the edge-contoured portion by bringing a polishing cloth in contact with same while dripping $SiO_2$, alumina, or some other abrasive thereon, or which removes the film from the edge-contoured portion by polishing with a grinder or abrasive-containing tape film.

The present invention, by performing a two-sided polishing process, a process for forming a CVD film on the backside of a wafer, and a one-sided polishing process for polishing the main surface when preparing a wafer for epitaxial growth, can achieve extremely outstanding flatness, can finish large-diameter wafers with particularly high precision, enables the epitaxial layer grown thereafter to be highly precise and of high quality, and also makes it possible to reliably remove a CVD film and thermal oxide film from the peripheral surface of the wafer.

Therefore, it is possible to achieve an outstanding effect, even if the reactant gas makes contact with the wafer peripheral surface in the epitaxial growth process, Si aggregates are not generated, and aggregated silicon does not fall off the wafer surface in the semiconductor device fabrication process and become the cause of contaminants adhering to the wafer surface. Furthermore, with the present invention, there is also the effect that the wafer peripheral surface portion is finished to a mirror surface, preventing the generation of dust, and reducing chipping from the wafer peripheral surface portion.

DETAILED DESCRIPTION OF THE PREFERRED EMBODIMENTS

Figure 1:
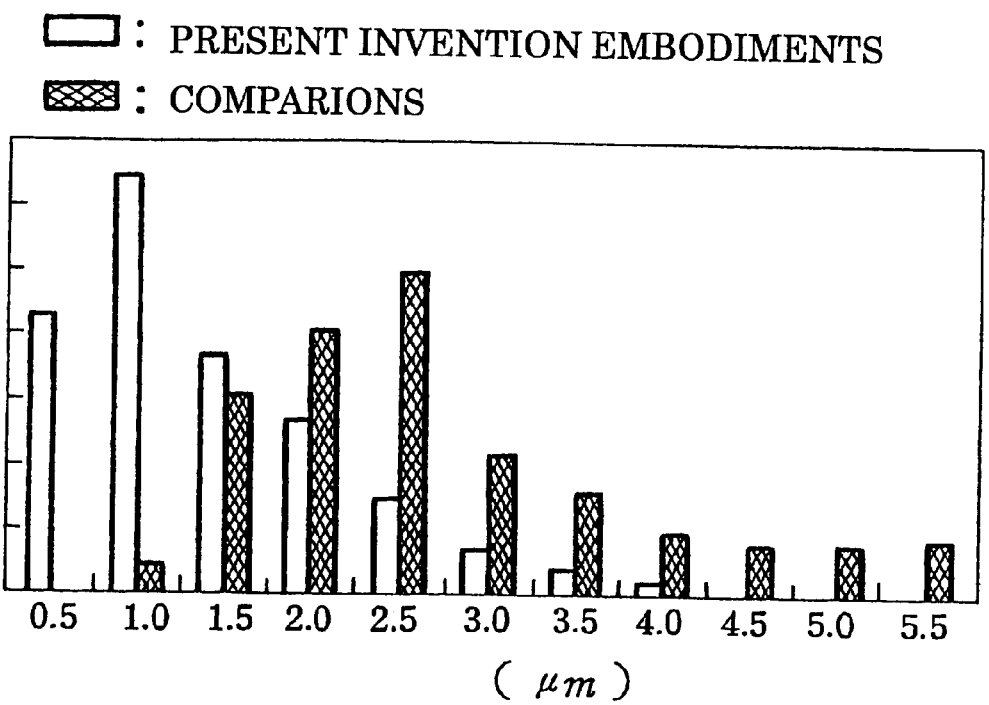
FIG. 1 is a graph showing the variations of wafer flatness of the embodiments.

The present invention is a manufacturing method for a semiconductor gas-phase epitaxial wafer, in which a thin, disc-shaped wafer is sliced from a single-crystal ingot, and a required surface is finished to a mirror surface. This manufacturing method being characterized in that a wafer, which has undergone slicing, or a further flat surface grinding process, for example, is subjected to a two-sided polishing process, in which both the front and back sides of the wafer are polished, a process, in which a CVD film or a thermal oxide film is formed on the backside of the wafer, and a one-sided polishing process, in which the main surface of the wafer is polished.

In the present invention, the two-sided polishing process, in which both the front and back sides of a wafer are polished, in addition to using a two-sided polishing apparatus to polish either one time or a plurality of times under the same conditions, both the front and back sides, can employ a process in which a two-sided polishing apparatus is used to perform primary polishing on both sides of a wafer, and then to perform finish polishing on one side thereof.

Further, in place of this two-sided polishing process, it is possible to employ a process comprising a grinding process, in which both sides are subjected to grinding, and a finish grinding process, in which either one side or both sides are subjected to high-precision, low-deformation finish grinding, or a process comprising a finish grinding process, in which both sides are subjected to high-precision, low-deformation finish grinding, and an alkali cleaning process.

In the present invention, two-sided grinding is capable of making the in-plane depth of the processing deformed layer less than 10 $\mu$m in accordance with performing grinding on both sides at the same time with a fixed abrasive grain without using free abrasive grain. In the finish grinding process, it is possible to make the in-plane depth of the processing deformed layer around 2~3 $\mu$m, and furthermore, to make the TTV (Total Thickness Variation) less than 1$\mu$m in accordance with using a fine fixed abrasive. It is therefore possible to omit the etching process, which is effective at removing the processing deformed layer, making it possible to also prevent wafer precision deterioration resulting from etching.

In the present invention, the process for forming a CVD film on the backside of a wafer may form a $SiO_2$ film on the backside of a wafer in a CVD reactor, and the process for forming a thermal oxide film on the backside of a wafer may form a $SiO_2$ film in accordance with oxidation in an oxygen-containing atmosphere inside an annealing furnace.

When a CVD film and thermal oxide film are formed on the backside of a wafer that has undergone two-sided polishing, the generation of Si aggregates by reactant gas coming in contact with the wafer peripheral surface in the epitaxial growth process, and the subsequent removal of this aggregated silicon from the wafer surface during the semiconductor device fabrication process, which is a cause of contaminants adhering to the wafer surface, can be prevented in accordance with removing the above-mentioned film, which has formed on the edge-contoured portion of the wafer.

In the present invention, the file stripping process removes the film from the edge-contoured portion by bringing an etchant-impregnated material in contact with same, or by bringing a polishing cloth in contact with same while dripping $SiO_2$, alumina, or some other abrasive thereon, or by polishing same with a grinder or abrasive-containing tape film. For example, after using a #1000~#3000 tape film, film stripping is performed by bringing a polishing cloth in contact with same while dripping $SiO_2$, $Al_2O_3$, or some other abrasive.

In the present invention, when grinding or polishing a plurality of wafers at the same time, the width of the contoured portion can be made uniform and processing precision improved. Also, particle generation in the device process can be reduced, and yield can be enhanced in accordance with making sure in advance that the thickness of the wafers falls within the prescribed range.

In the present invention, the peripheral portion of a wafer does not make contact with other wafers or types of equipment during two-sided grinding and/or two-sided polishing. In accordance with being performed in the single-wafer mode, the edge-contoured portion is not subjected to damage, making it possible to reduce particle generation in the device process, and to enhance yield.

In the present invention, the one-sided mirror-finish polishing process, in which the main surface of a wafer is polished, makes use of a one-sided mirror-finish polishing apparatus, or a two-sided mirror-finish polishing apparatus to perform polishing one time or a plurality of times, and as a rule, can be performed using the same apparatus together with primary polishing, and finish polishing.

As a condition of finish polishing, it is desirable that the Shore hardness of the cloth be between 30~40, these are called urethane foam or suede type cloth. Also it is desirable to use a finishing abrasive, which adds a surface additive to an $SiO_2$ concentration of less than 1% by weight.

EMBODIMENTS

Embodiment 1

A 12-inch diameter CZ silicon wafer, which had undergone a slicing process and a flat grinding process, was subjected to polishing to remove around 10~30 μm from both the front and back sides of the wafer, using a two-sided mirror-finish polishing apparatus. After which, a CVD film was grown on the backside of the wafer, the CVD film was removed from the edge-contoured portion, and the main surface of the wafer was finished by one-sided mirror-finish polishing using two-sided mirror-finish polishing apparatus to remove around 2 μm. The flatness of 100 wafers thus produced was measured using an electrostatic capacity-type sensor, and a laser displacement gauge. The flatness variations thereof are shown in FIG. 1.

Compararison 1

A 12-inch diameter CZ silicon wafer, which had undergone a slicing process and an edge contouring process, was subjected to a lapping process. After which, the backside was etched, and a CVD film was grown on the backside. Then the CVD film was removed from the edge-contoured portion, and the main surface of the wafer was finished by one-sided mirror-finish polishing using a two-sided mirror-finish polishing apparatus to remove between 10~20 μm. The flatness of 100 wafers thus produced was measured using an electrostatic capacity-type sensor, and a laser displacement gauge. The flatness variations thereof are shown in FIG. 1.

As shown in FIG. 1, it is clear that the flatness of wafers resulting from the processing of the present invention is of higher precision than that of the comparative examples resulting from conventional processing.

Further, in the first embodiment, the method used to remove the CVD film from the edge-contoured portion involved applying a head, with a built-in abrasive grain-holding tape film, to the peripheral surface of the wafer. Also an edge-contoured portion mirror finishing process, which mirror finishes the edge-contoured portion of the wafer to low deformation, could also be used here.

Furthermore, it was ascertained that a grinding process, which grinds both sides, and a finish grinding process, which finish grinds both surfaces with a high degree of precision and low deformation, can be carried out in place of the two-sided mirror-finish polishing process of the first embodiment, achieving the same effect.

Embodiment 2

When a CVD film and thermal oxide film are formed on the backside of a wafer that has been polished on both sides, the above-mentioned film is also formed on the peripheral surface of the wafer, where Si aggregates are readily formed. Embodiment 2 makes it possible to remove the above-mentioned film, which is formed either on this wafer peripheral surface, or for about 0~5 μm toward the backside of the wafer from the peripheral surface, and furthermore, makes it possible to clamp a wafer in a rotating drive shaft chuck, and to remove the film from the peripheral surface of the wafer, and from the above-mentioned range of the in-plane portion by applying a head with a built-in non-woven fabric cloth impregnated with etchant to the film to be removed from the peripheral surface and other portions of the wafer while rotating the wafer around the drive shaft. It was ascertained that the same effect as that of the first embodiment is achieved.

Embodiment 3

Embodiment 3 clamps a wafer in a rotating drive shaft chuck, and removes the film from the peripheral surface of the wafer, and from the above-mentioned range of the in-plane portion by applying a head with a built-in abrasive grain-holding tape film to the film to be removed from the peripheral surface and other portions of the wafer while rotating the wafer around the drive shaft. It was ascertained that the same effect as that of the first embodiment is achieved.

What is claimed is:

1. A method for manufacturing a semiconductor gas-phase epitaxial wafer, comprising:
    a double side polishing process for polishing simultaneously both front and back surfaces of a wafer by a double side polishing device;
    a process for forming either a CVD film or a thermal oxide film on the back of the wafer; and
    a one-sided mirror-finish polishing process for polishing a main surface by using the double side polishing device.

2. The method for manufacturing a semiconductor gas-phase epitaxial wafer according to claim 1, wherein the double side polishing process comprises either a grinding process for grinding both sides of the wafer, and a finish grinding process for finish grinding either one side or two sides of the wafer with high precision and low damage, or a finish grinding process for finish grinding both sides of the wafer with high precision and low damage, and an alkali cleaning process.

3. A method for manufacturing a semiconductor gas-phase epitaxial wafer, comprising:
    a double side polishing process for polishing simultaneously both front and back surfaces of a wafer by a double side polishing device;
    a process for forming either a CVD film or a thermal oxide film on the back of the wafer;
    a process for removing said film formed on a chamfered portion of the wafer; and
    a one-sided mirror-finish polishing process for polishing a main surface of the wafer by using the double side polishing device.

4. The method for manufacturing a semiconductor gas-phase epitaxial wafer according to claim 3, wherein the double side polishing process comprises either a grinding process for grinding both sides of the wafer, and a finish grinding process for finish grinding either one side or two sides of the wafer with high precision and low damage, or a finish grinding process for finish grinding both sides of the wafer with high precision and low damage, and an alkali cleaning process.

5. The method for manufacturing a semiconductor gas-phase epitaxial wafer according to claim 3, wherein the film on the chamfered contoured portion of the wafer is removed by bringing an etchant-impregnated material in contact therewith.

6. The method for manufacturing a semiconductor gas-phase epitaxial wafer according to claim 3, wherein the film on the chamfered contoured portion of the wafer is removed by bringing a polishing cloth in contact therewith while dripping abrasive thereon.

7. The method for manufacturing a semiconductor gas-phase epitaxial wafer according to claim wherein the film on the chamfered contoured portion of the wafer is removed in accordance with either a grindstone, or a tape film containing an abrasive.

* * * * *

UNITED STATES PATENT AND TRADEMARK OFFICE
CERTIFICATE OF CORRECTION

PATENT NO.    : 6,211,088 B1
DATED         : April 3, 2001
INVENTOR(S)   : Sumihisa Masuda et al.

It is certified that error appears in the above-identified patent and that said Letters Patent is hereby corrected as shown below:

Column 1,
Line 40, "100º C." should read -- 1000º C, --.

Column 6,
Line 11, "0~5 $\mu$m" should read -- 0~5mm --.

Column 8,
Line 7, "claim" should read -- claim 5 --.

Signed and Sealed this

Tenth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO.    : 6,211,088 B1
DATED         : April 3, 2001
INVENTOR(S)   : Sumihisa Masuda et al.

It is certified that error appears in the above-identified patent and that said Letters Patent is hereby corrected as shown below:

Column 1,
Line 40, "100º C." should read -- 1000º C, --.

Column 6,
Line 11, "0~5 $\mu$m" should read -- 0~5mm --.

Column 8,
Line 7, "claim" should read -- claim 3 --.

This cerificate supersedes Certificate of Correction issued December 10, 2002.

Signed and Sealed this

First Day of April, 2003

JAMES E. ROGAN
*Director of the United States Patent and Trademark Office*